(12) United States Patent
Siemieniec et al.

(10) Patent No.: US 12,419,096 B2
(45) Date of Patent: Sep. 16, 2025

(54) TRANSISTOR DEVICE AND METHOD OF MANUFACTURING

(71) Applicant: Infineon Technologies AG, Neubiberg (DE)

(72) Inventors: Ralf Siemieniec, Villach (AT); Ingo Muri, Villach (AT); Till Schloesser, Munich (DE); Hans-Joachim Schulze, Taufkirchen (DE); Olaf Storbeck, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 472 days.

(21) Appl. No.: 17/590,685

(22) Filed: Feb. 1, 2022

(65) Prior Publication Data

US 2022/0246744 A1 Aug. 4, 2022

(30) Foreign Application Priority Data

Feb. 4, 2021 (EP) ..................... 21155278

(51) Int. Cl.
*H10D 64/66* (2025.01)
*H01L 25/07* (2006.01)
(Continued)

(52) U.S. Cl.
CPC ......... *H10D 64/665* (2025.01); *H01L 25/072* (2013.01); *H10D 30/60* (2025.01); *H10D 64/01* (2025.01)

(58) Field of Classification Search
CPC ... H01L 29/495; H01L 25/072; H01L 29/401; H01L 29/78; H01L 29/417; H01L 21/049;
(Continued)

(56) References Cited

U.S. PATENT DOCUMENTS 9,171,918 B2 10/2015 Ahrens et al.
9,680,004 B2 6/2017 Laforet et al.
(Continued)

FOREIGN PATENT DOCUMENTS

DE 102004049452 A1 4/2006
EP 3863066 A1 8/2021

OTHER PUBLICATIONS

European Search Report, from Corresponding European Application No. 21155278.1, dated Jul. 2, 2021.
(Continued)

*Primary Examiner* — Steven B Gauthier
*Assistant Examiner* — Khatib A Rahman
(74) *Attorney, Agent, or Firm* — Cooper Legal Group LLC

(57) ABSTRACT

A transistor device is provided. In an example, the transistor device includes a semiconductor body having a first main surface, a second main surface opposite to the first main surface. The transistor device further includes a transistor cell array including a plurality of transistor cells. The transistor cell array includes a first load electrode over the first main surface. The first load electrode is electrically connected to the plurality of transistor cells. The transistor cell array further includes a second load electrode over the second main surface. The second load electrode is electrically connected to the plurality of transistor cells. The plurality of transistor cells includes at least one control electrode including carbon.

20 Claims, 4 Drawing Sheets

(51) Int. Cl.
*H10D 30/60* (2025.01)
*H10D 64/01* (2025.01)

(58) Field of Classification Search
CPC ............. H01L 29/0696; H01L 29/1095; H01L 29/1608; H01L 29/407; H01L 29/49; H01L 29/66068; H01L 29/7813; H01L 29/7397; H01L 29/7827; H01L 29/42312; H01L 29/4236; H01L 29/7398; B82Y 10/00; H10D 64/665; H10D 30/60; H10D 64/01; H10D 30/668; H10D 12/481; H10D 64/23; H10D 62/8325; H10D 64/66; H10D 12/031; H10D 62/127; H10D 62/393; H10D 64/117; H10D 12/491; H10D 64/311; H10D 64/513; H10D 30/63

See application file for complete search history.

(56) References Cited

U.S. PATENT DOCUMENTS

| | | | | |
|---|---|---|---|---|
| 9,917,082 | B1* | 3/2018 | Basker | .................... H01L 28/24 |
| 2009/0045161 | A1 | 2/2009 | Liebau et al. | |
| 2012/0228631 | A1 | 9/2012 | Kono et al. | |
| 2013/0001703 | A1* | 1/2013 | Sugawara | ........... H01L 29/0657 |
| | | | | 257/E27.06 |
| 2013/0049120 | A1 | 2/2013 | Sandhu | |
| 2015/0055394 | A1* | 2/2015 | Iwasa | ..................... G11C 5/025 |
| | | | | 257/334 |
| 2016/0133741 | A1* | 5/2016 | Matsuki | ............ H01L 29/66068 |
| | | | | 257/77 |
| 2017/0104078 | A1 | 4/2017 | Laforet et al. | |
| 2017/0222002 | A1* | 8/2017 | Chen | .................... H10D 62/393 |
| 2017/0263712 | A1* | 9/2017 | Siemieniec | ......... H01L 29/1608 |
| 2018/0337259 | A1* | 11/2018 | Cheng | ................. H01L 29/7827 |
| 2020/0176580 | A1 | 6/2020 | Siemieniec et al. | |
| 2021/0320008 | A1* | 10/2021 | Kim | .................... H01L 29/4236 |

OTHER PUBLICATIONS

Derrick W. Foster, et al., "An In-Situ Phosphorus Doped Polysilicon Deposition Process Optimized for Production", V-Mic Conference, Jun. 1986, pp. 523-529.

G. Aichmayr, et al., "Carbon/high-k Trench Capacitor for the 40nm DRAM Generation", Qimonda Dresden GmbH & Co., OHG, Dresden, Germany, Presentation 2007.

Qimonda AG, "Forms of Carbon", Presentation 2006.

Olaf Storbeck, et al., "Formation of 3-dimensional microstructures based on pyrolytic carbon deposition and oxidative carbon removal", Infineon, Mar. 2006.

Hiromasa Murata, et al., "High-Electrical-Conductivity Multilayer Graphene Formed by Layer Exchange with Controlled Thickness and Interlayer", Scientific Reports, Mar. 11, 2019, pp. 1-5.

* cited by examiner

TRANSISTOR DEVICE AND METHOD OF MANUFACTURING

RELATED APPLICATION

This application claims priority to European Patent Application No. 21155278, filed on Feb. 4, 2021, entitled "TRANSISTOR DEVICE AND METHOD OF MANUFACTURING", which is incorporated by reference herein in its entirety.

TECHNICAL FIELD

The present disclosure is related to a transistor device and a method of manufacturing a transistor device, for example to a transistor device comprising a plurality of transistor cells including a control electrode.

BACKGROUND

Technology development of new generations of transistor devices, e.g. insulated gate field effect transistors (IGFETS) such as metal oxide semiconductor field effect transistors (MOSFETs) or insulated gate bipolar transistors (IGBTs), aims at improving electric device characteristics and reducing costs by shrinking device geometries. Although costs may be reduced by shrinking device geometries, a variety of tradeoffs and challenges have to be met when increasing device functionalities per unit area. For example, shrinking of device geometries may be accompanied by challenges in view of meeting demands on heat dissipation per unit chip area, device reliability, or switching speeds. There may be a desire for improved concepts for transistor devices and methods of manufacturing.

SUMMARY

An example of the present disclosure relates to a transistor device. The transistor device includes a semiconductor body having a first main surface, a second main surface opposite to the first main surface, and a transistor cell array. The transistor cell array includes a plurality of transistor cells. The transistor cell array further includes a first load electrode over the first main surface. The first load electrode is electrically connected to the plurality of transistor cells. The transistor cell array further includes a second load electrode over the second main surface. The second load electrode is electrically connected to the plurality of transistor cells. The plurality of transistor cells includes at least one control electrode comprising carbon. In some examples, the carbon of the at least one control electrode comprises allotropes single-layered graphene, double-layered graphene, multi-layered graphene, graphenic-like carbon and/or carbon nanotubes. In some examples, the carbon of the at least one control electrode adjoins (e.g., directly adjoins) a dielectric opposite to a channel region. In some examples, the at least one control electrode comprises a gate electrode. In some examples, the carbon of the at least one control electrode adjoins (e.g., directly adjoins) the dielectric opposite to the channel region for being configured as the gate electrode.

An example of the present disclosure relates to a method of manufacturing a transistor device. The method includes providing a semiconductor body having a first main surface, and a second main surface opposite to the first main surface. The method further includes forming a transistor cell array. Forming the transistor cell array includes forming a plurality of transistor cells. The plurality of transistor cells includes at least one control electrode comprising carbon. In some examples, the carbon of the at least one control electrode comprises allotropes single-layered graphene, double-layered graphene, multi-layered graphene, graphenic-like carbon and/or carbon nanotubes. In some examples, the carbon of the at least one control electrode adjoins (e.g., directly adjoins) a dielectric opposite to a channel region. In some examples, the at least one control electrode comprises a gate electrode. In some examples, the carbon of the at least one control electrode adjoins (e.g., directly adjoins) the dielectric opposite to the channel region for being configured as the gate electrode. Forming the transistor cell array further includes forming a first load electrode over the first main surface. The first load electrode is electrically connected to the plurality of transistor cells. Forming the transistor cell array further includes forming a second load electrode over the second main surface. The second load electrode is electrically connected electrically connected to the plurality of transistor cells.

An example of the present disclosure relates to a transistor device. The transistor device includes a semiconductor body having a first main surface, a second main surface opposite to the first main surface, and a transistor cell array. The transistor cell array includes a plurality of transistor cells. The transistor cell array further includes a first load electrode over the first main surface. The first load electrode is electrically connected to the plurality of transistor cells. The transistor cell array further includes a second load electrode over the second main surface. The second load electrode is electrically connected to the plurality of transistor cells. The plurality of transistor cells includes at least one control electrode comprising carbon. In some examples, the carbon of the at least one control electrode comprises allotropes single-layered graphene, double-layered graphene, multi-layered graphene, graphenic-like carbon and/or carbon nanotubes. In some examples, the carbon of the at least one control electrode adjoins (e.g., directly adjoins) a dielectric opposite to a channel region. In some examples, the at least one control electrode comprises a gate electrode comprising a planar gate electrode and/or a trench gate electrode. In some examples, the carbon of the at least one control electrode adjoins (e.g., directly adjoins) the dielectric opposite to the channel region for being configured as the gate electrode. The transistor device includes a cap layer adjoining the at least one control electrode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of transistor devices and together with the description serve to explain principles of the examples. Further examples are described in the following detailed description and the claims.

DETAILED DESCRIPTION

Figure 1:
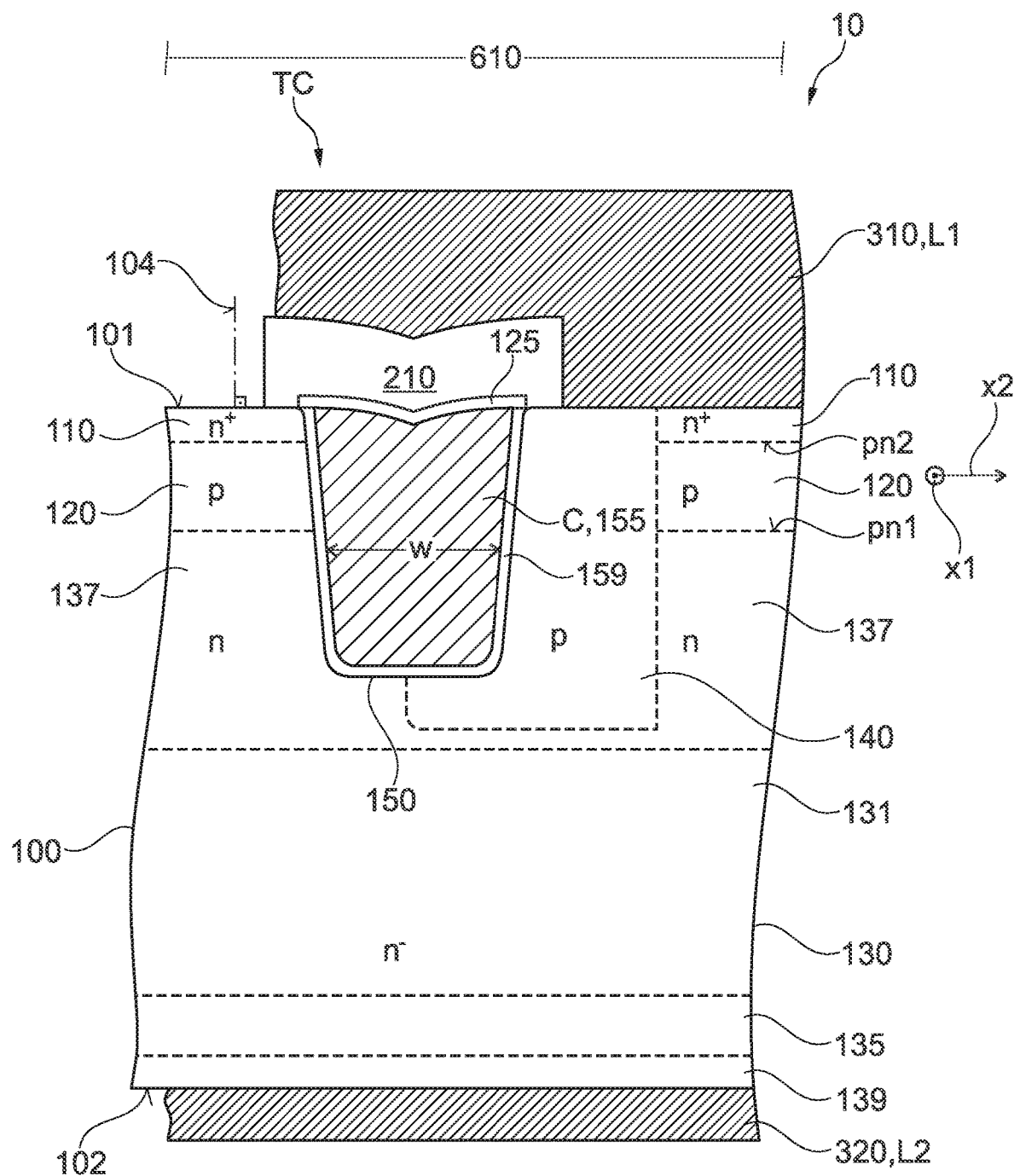
FIGS. 1 and 2 are schematic cross-sectional views for illustrating examples of transistor devices including a trench gate electrode comprising carbon and a shielding region.

In the following detailed description, reference is made to the accompanying drawings, which form a part hereof and in which are shown by way of illustrations specific examples in which semiconductor substrates may be processed. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, silicon (Si) and carbon (C) are the main constituents of a silicon carbide (SiC) layer.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a transistor device may comprise a semiconductor body having a first main surface, a second main surface opposite to the first main surface, and a transistor cell array. The transistor cell array may comprise a plurality of transistor cells. The transistor cell array may further comprise a first load electrode over the first main surface. The first load electrode may be electrically connected to the plurality of transistor cells. For example, the first load electrode may be electrically connected to each of the plurality of transistor cells. The transistor cell array may further comprise a second load electrode over the second main surface. The second load electrode may be electrically connected to the plurality of transistor cells. For example, the second load electrode may be electrically connected to each of the plurality of transistor cells. The plurality of transistor cells may include at least one control electrode comprising carbon.

For example, the transistor device may be an insulated gate field effect transistor (IGFET), e.g. a metal oxide semiconductor field effect transistor (MOSFET). The transistor device may also be an insulated gate bipolar transistor (IGBT), for example.

The semiconductor body may include and/or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

For example, the semiconductor body may be a crystalline SiC semiconductor substrate. For example, the silicon carbide crystal may have a hexagonal polytype, e.g., 4H or 6H. The silicon carbide semiconductor body may be homogeneously doped or may include differently doped SiC layer portions. The silicon carbide semiconductor body may include one or more layers from another material with a melting point close to or higher than crystalline silicon carbide. For example, the layers from another material may be embedded in the crystalline silicon carbide substrate. The silicon carbide semiconductor substrate may have two essentially parallel main surfaces of the same shape and size and a lateral surface area connecting the edges of the two main surfaces.

For example, the transistor cells of the transistor cell array may have a same layout. The transistor cell array may be a 1-dimensional or 2-dimensional regular arrangement of a plurality of transistor cells. For example, the plurality of transistor cells of the transistor cell array may be electrically connected in parallel. For example, source regions of the plurality of transistor cells of an IGFET or IGBT transistor cell array may be electrically connected together. Likewise, drain regions of the plurality of transistor cells of an IGFET transistor cell array may be electrically connected together, or collector regions of the plurality of transistor cells of an IGBT transistor cell array may be electrically connected together. For example, gate electrodes of the plurality of transistor cells of an IGFET or IGBT transistor cell array may be electrically connected together. A transistor cell of the transistor cell array or a part thereof, e.g. the gate electrode, may be designed in the shape of a stripe, a polygon, a circle or an oval, for example.

For example, the first load electrode, e.g. a source (emitter) electrode of an IGFET (IGBT), may be a contact area and be formed by all or part of a wiring layer. For example, the wiring layer may correspond to one wiring level of a wiring area above the first main surface, wherein the one wiring level of the wiring area may be located closest to the first main surface in case of multiple wiring levels. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an intermediate dielectric may be arranged. Contact plug(s) or contact line(s) may be formed in openings in the intermediate dielectric to electrically connect parts, e.g. metal lines or contact areas, of different wiring levels to one another. For example, the contact area of the first load electrode may be electrically connected to a source region of each of the plurality of transistor cells in the semiconductor body by contact plugs arranged between the source region and the contact area of the first load electrode.

Similar to the first load electrode, the second load electrode, e.g. a drain electrode of an IGFET or a collector electrode of an IGBT, may be a contact area and be formed by all or part of another wiring layer. For example, the other wiring layer may correspond to one wiring level of a wiring area above the second main surface. Structural variations of the wiring area and/or the second load electrode over the second main surface may be similar to the structural variations described above with respect to the wiring area and/or the first load electrode.

For example, the transistor device may be part of an integrated circuit, or a discrete transistor device. The transistor device may be a power transistor device, e.g. a vertical power transistor device having a load current flow between the first load electrode over the first main surface of the semiconductor body and the second load electrode over the second main surface.

In the vertical transistor device, a load current may flow along the vertical direction perpendicular to the first and/or second main surface. The transistor device may be configured to conduct currents of more than 1 ampere (A) or more than 10 A or even more than 30 A. A number of transistor cells of the transistor cell array may depend on the maximum load current, for example. For example, a number of transistor cells of the transistor cell array may be larger than 100, or larger than 1000, or even larger than 10000, for example. The power transistor device may be further configured to block voltages between the load terminals, e.g. between emitter and collector of an IGBT or between drain and source of a MOSFET, of more than 10 volts (V), 12 V, 60V, 100V, 400 V, 650V, 1.2 kilovolts (kV), 1.7 kV, 3.3 kV, 4.5 kV, 5.5 kV, 6 kV, 6.5 kV. The blocking voltage may correspond to a voltage class specified in a datasheet of the power transistor device, for example. The blocking voltage of the transistor device may be adjusted by an impurity concentration and/or a vertical extension of a drift region in the semiconductor body. A doping concentration of the drift region may gradually or in steps increase or decrease with increasing distance to the first main surface at least in portions of its vertical extension. According to other examples the impurity concentration in the drift region may be approximately uniform. For power transistors based on silicon, a mean impurity concentration in the drift region may be between $2 \times 10^{12}$ centimeters$^{-3}$ (cm$^{-3}$) and $1 \times 10^{17}$ cm$^{-3}$, for example in a range from $5 \times 10^{12}$ cm$^{-3}$ to $1 \times 10^{15}$ cm$^{-3}$ or to $2 \times 10^{14}$ cm$^{-3}$. In some cases, the mean impurity concentration in the drift region for power transistors based on silicon may be in a range from $1 \times 10^{15}$ cm$^{-3}$ to $1 \times 10^{17}$ cm$^{-3}$. In the case of a power transistor device based on SiC, a mean impurity concentration in the drift region may be between $5 \times 10^{14}$ cm$^{-3}$ and $1 \times 10^{17}$ cm$^{-3}$, for example in a range from $1 \times 10^{15}$ cm$^{-3}$ to $2 \times 10^{16}$ cm$^{-3}$. A vertical extension of the drift region may depend on voltage blocking requirements, e.g. a specified voltage class, of the vertical power transistor device. When operating the vertical power transistor device in voltage blocking mode, a space charge region may vertically extend partly or totally through the drift region depending on the blocking voltage applied to the vertical power transistor device. When operating the vertical power transistor device at or close to the specified maximum blocking voltage, the space charge region may reach or penetrate into a field stop region that is configured to prevent the space charge region from further reaching to a drain contact or collector contact at the second main surface of the semiconductor body. For IGBTs, in this manner, the drift region may be formed using desired low doping levels (e.g., doping levels lower than a threshold doping level) and with a desired thickness while achieving soft switching.

For example, the at least one control electrode comprising carbon may be a control electrode configured to control a conductivity of a transistor channel region by field-effect. In other words, the at least one control electrode may include a gate electrode. In addition or as an alternative, the at least one control electrode comprising carbon may be a control electrode configured to control an electric field distribution and parasitic capacitance. In other words, the at least one control electrode may include a so-called field electrode.

The at least one control electrode comprising carbon may provide a number of technical benefits. For example, an increase of a conductivity of the electrode material compared with typical electrode materials, e.g. doped polycrystalline silicon, may be achieved. This may allow for increasing a switching speed of the transistor device, for example. For example, dependency of a sheet resistance of the control electrode from a thickness of the control electrode may be reduced compared with typical control electrodes, e.g. doped polycrystalline silicon. Moreover, the control electrode comprising carbon may withstand high temperature processes (e.g., processes performed at a temperature higher than a threshold temperature) and high temperature stress during operation due to a high sublimation temperature (e.g., a sublimation temperature higher than a threshold temperature). Moreover, trenches having a high aspect ratio, e.g. height:width of 80:1, may be filled. Also, conventional chemical vapor deposition equipment may be used for manufacturing the control electrode comprising carbon. In view of the large number of chemical carbon compounds offering a variety of different configurations and enthalpies of formation, competitive precursor materials are available. This may include halogen-free precursor materials for avoiding damage to gate oxide layers, for example. Control electrodes comprising carbon may also be patterned using process equipment already available in semiconductor manufacturing plants, e.g. fabs. Control electrodes comprising carbon may also be beneficial with respect to reducing wafer bow caused by low mechanical stress (e.g., mechanical stress lower than a threshold) of carbon electrode materials in Si or SiC transistor devices, for example. Control electrodes comprising carbon may also allow for reducing probability of stress-induced cracks compared with other typical electrode materials, e.g. metals. Thus, a control electrode comprising carbon may be beneficial with respect to ease of manufacture, high temperature stability (e.g., temperature stability higher than a threshold temperature stability), and high conductivity (e.g., conductivity higher than a threshold conductivity). The control electrode comprising carbon may also allow for avoiding or reducing active area consuming electrode finger designs that are typically used for keeping electrode driving speeds low.

For example, the transistor device may further comprise a cap layer adjoining the at least one control electrode. For example, the cap layer may include a material configured to act as an oxygen diffusion barrier. For example, the cap layer may adjoin or encapsulate the at least one control electrode. The cap layer may also adjoin one or more layers to form an encapsulation structure, wherein each of the one or more layers may also be configured to act as an oxygen diffusion barrier. The encapsulation structure may encapsulate, e.g. fully surround, the at least one control electrode. For example, the cap layer may comprise, e.g. as the oxygen barrier layer, a nitride layer, a silicon carbide layer, and/or a polycrystalline silicon layer. Carbides, e.g. TiC or ternary carbides may also be used as the cap layer, for example.

For example, the carbon of the at least one control electrode may comprise at least one of allotropes single-layered graphene, double-layered graphene, multi-layered graphene, graphenic-like carbon or carbon nanotubes. The carbon may be pyrolytic carbon, for example. Formation of pyrolytic carbon can for example be realized in a LPCVD (low pressure chemical vapor deposition)-batch reactor by deposition at temperatures in the range of 700° C. to 1000° C. and at a pressure in the range of 10 Pa to 1000 Pa. As precursors gaseous or liquid hydrocarbons from the substance classes aliphatic, aromatics and heteroaromatics such as methane, ethane, ethene, ethanole, toluene or pyridine may be used. Process parameters such as the deposition rate and the deposition temperature, which can influence the graphenic-like characteristics, may be appropriately chosen for enabling a well-defined adjustment of the resistivity of the carbon layers. The carbon of the at least one control electrode may differ from any compound of carbon. For example, SiC may not qualify as a control electrode comprising carbon. For example, the at least one control electrode may comprise (and/or may be) a gate electrode, and the at least one of the allotropes single-layered graphene, double-layered graphene, multi-layered graphene, graphenic-like carbon or carbon nanotubes may adjoin (e.g., directly adjoin) a dielectric, e.g. gate dielectric, opposite to a channel region. In some examples, the carbon of the at least one control electrode (e.g., the carbon comprising the at least one of the allotropes single-layered graphene, double-layered graphene, multi-layered graphene, graphenic-like carbon or carbon nanotubes) may adjoin (e.g., directly adjoin) the dielectric opposite to the channel region for being configured as the gate electrode. For example, at least 60%, or at least 70%, or at least 80%, or at least 90%, e.g. vol %, of the gate electrode may be formed by the at least one of the allotropes single-layered graphene, double-layered graphene, multi-layered graphene, graphenic-like carbon or carbon nanotubes. For example, only a small part of the gate electrode, e.g. less than 40%, or less than 30%, or less than 20%, or less than 10%, e.g. vol %, of the gate electrode may be formed by a material other than carbon, e.g. a carbon compound or any other material suitable for a control electrode. For example, the gate electrode may be formed by a single layer, or a stack of layers, e.g. a stack of layers formed by different allotropes of carbon.

For example, the at least one control electrode comprising carbon may include a planar gate electrode or a trench gate electrode. For a planar gate electrode, a planar gate dielectric may be arranged on the first main surface between a channel region in the semiconductor body and the planar gate electrode. For a trench gate electrode, a trench gate dielectric may line at least part of sidewalls of a trench, wherein the trench gate dielectric is arranged between a channel region in the semiconductor body and the trench gate electrode. For example, the plurality of transistor cells may be formed as stripes extending in parallel along a first lateral direction, e.g. a longitudinal direction of the gate electrode. For example, a ratio of a length of the trench gate electrode to a width of the trench gate electrode may range between $10^2$ and $10^5$. The width may relate to an extension of the trench gate electrode along a second lateral direction that is perpendicular to the first lateral direction at a vertical level located at a center between the first main surface and a bottom side of the trench gate electrode. In other words, the width may be taken at half of a depth of the trench gate electrode with respect to the first main surface. The length may relate to an extension of the trench gate electrode along the first lateral direction. For example, the width ranges may range between 50 nanometers (nm) and 1 micrometer (µm), or between 50 nm and 500 nm, or between 50 nm and 300 nm.

The transistor device may further comprise a trench field electrode. A ratio of a maximum lateral extension of the trench field electrode to a maximum vertical extension of the trench field electrode may range between 0.05 and 0.5. The maximum lateral extension may correspond to the extension taken at or close to the first main surface, for example. The trench including the trench field electrode may have the shape of a needle, for example. The trench field electrode and the trench gate electrode may be arranged in trenches laterally separated from one another. For example, a ratio of a minimum lateral extension of the trench field electrode to a maximum lateral extension of the trench field electrode at a vertical reference level, e.g. the first main surface, may range between 0.2 and 1. For example, a shape of the trench field electrode viewed from top may be a square, a rectangle, a circle, an oval, an octagon, and/or a hexagon. For example, an electric conductivity of a material of the trench field electrode may be smaller than an electric conductivity of a material of the trench gate electrode. For example, the trench gate electrode may include and/or consist of carbon and the trench field electrode may include and/or consist of doped polycrystalline silicon.

For example, the at least one control electrode comprising carbon may include a trench field electrode. The trench field electrode may be arranged between a trench gate electrode and the second main surface. For example, the trench field electrode and the trench gate electrode may include a carbon electrode. As an alternative, the trench gate electrode may be formed by an electrode material different from carbon, for example.

For example, the transistor device may comprise a drift region. The drift region may be configured for a breakdown voltage between the first load electrode and the second load electrode of greater than 12V or greater than 100V or greater than 500V or even greater than 1000V, e.g. by adjusting a thickness and/or vertical doping concentration profile in the drift region. For example, the drift region may be formed in a silicon semiconductor body.

For example, the drift region may be formed in a silicon carbide semiconductor body. The transistor device may be an insulated gate field effect transistor or an insulated gate bipolar transistor. The at least one control electrode may include a trench gate electrode. The transistor device may further include a shielding region of a conductivity type different from a conductivity type of the drift region. A bottom side of the shielding region may be arranged between a bottom side of a gate trench including the trench gate electrode and the second main surface. The shielding region may be configured to avoid degradation of a life-time of the gate dielectric by shielding the gate dielectric from high electric fields.

Structural and functional details described with regard to features of the transistor device above may likewise apply to the corresponding features related to the exemplary methods below.

A method of manufacturing a transistor device may include providing a semiconductor body having a first main surface, and a second main surface opposite to the first main surface. The method may further include forming a transistor cell array. Forming the transistor cell array may include forming a plurality of transistor cells. The plurality of transistor cells may include at least one control electrode comprising carbon. Forming the transistor cell array may further include forming a first load electrode over the first main surface. The first load electrode may be electrically connected to the plurality of transistor cells, e.g. to each of the plurality of transistor cells. Forming the transistor cell array may further include forming a second load electrode over the second main surface. The second load electrode may be electrically connected to the plurality of transistor cells, e.g. to each of the plurality of transistor cells.

For example, providing the semiconductor body and forming the transistor cell array may further include at least one of process features i1) to i7) below. Process feature i1) includes forming a trench from the first main surface into the semiconductor body, wherein the semiconductor body includes a silicon substrate. Process feature i2) includes forming a trench field dielectric in the trench. Process feature i3) includes forming a trench field electrode in the trench, wherein the trench field electrode includes carbon. Process feature i4) includes forming a cap layer on the carbon in the trench. Process feature i5) includes forming a trench gate dielectric in the trench. Process feature i6) includes forming a trench gate electrode in the trench. Process feature i7) may follow (e.g., follow at least one of process features i1) to i6)), wherein process feature i7) includes forming doped semiconductor regions in the semiconductor body. Process feature i7), or part thereof, may also be carried out prior to process feature i1) or between process features described above. For example, one or more doped semiconductor regions may be formed at different times during the manufacturing process, for example.

For example, the method may further include forming a second cap layer on the trench gate electrode in the trench, wherein the trench gate electrode includes carbon. Functional details described above with reference to the cap layer adjoining the control electrode likewise apply to the second cap layer.

For example, providing the semiconductor body and forming the transistor cell array may further include at least one of process features k1) to k8) below. Process feature k1) includes forming a field electrode trench from the first main surface into the semiconductor body, wherein the semiconductor body includes a silicon substrate, and wherein a ratio of a maximum lateral extension of the field electrode trench at the first main surface to a maximum vertical extension of the field electrode trench ranges between 0.05 and 0.5. Process feature k2) includes forming a trench field dielectric in the field electrode trench. Process feature k3) includes forming a trench field electrode in the field electrode trench. Process feature k4) includes forming a trench gate electrode trench from the first main surface into the semiconductor body. Process feature k5) includes forming a trench gate dielectric in the gate electrode trench. Process feature k6) includes forming a trench gate electrode in the gate electrode trench, wherein the trench gate electrode includes carbon. Process feature k7) includes forming a cap layer on the carbon in the gate electrode trench Process feature k8) may follow (e.g., may be performed after at least one of process features k1) to k7)), wherein process feature k8) includes forming doped semiconductor regions in the semiconductor body. Process feature k8), or part thereof, may also be carried out prior to process feature k1) or between process features described above. For example, one or more doped semiconductor regions may be formed at different times during the manufacturing process, for example.

For example, the method may further include forming a second cap layer on the trench field electrode in the trench, wherein the trench field electrode includes carbon. Functional details described above with reference to the cap layer adjoining the control electrode likewise apply to the second cap layer.

For example, providing the semiconductor body and forming the transistor cell array may further include at least one of process features m1) to m5) below. Process feature m1) includes forming doped semiconductor regions in the semiconductor body, wherein the semiconductor body includes a silicon carbide substrate. At least one of process features m2) to m5) may follow (e.g., may be performed after process feature m1)). Process feature m2) includes forming a trench from the first main surface into the semiconductor body. Process feature m3) includes forming a trench gate dielectric in the trench. Process feature m4) includes forming a trench gate electrode in the trench, wherein the trench gate electrode includes carbon. Process feature m5) includes forming a cap layer on the carbon in the trench.

The above process features may be combined with at least one of process features a1) to a4) below. Process feature a1) includes forming a patterned mask over the first main surface of the semiconductor body. Process feature a2) includes using the patterned mask for etching a trench into the semiconductor body from the first main surface. Process feature a3) includes forming an electrode material in the trench may be followed by recessing part of the electrode material, e.g. electrode material outside of the trench. Process feature a4) includes forming a wiring area over the first main surface, wherein forming the wiring area includes forming at least one interlayer dielectric over the first main surface and forming at least one metal layer over the first main surface.

The examples and features described above and below may be combined.

Some of the above and below examples are described in connection with a silicon carbide substrate. Alternatively, a wide band gap semiconductor substrate, e.g. a wide band gap wafer, may be processed, e.g. comprising a wide band gap semiconductor material different from silicon carbide. The wide band gap semiconductor wafer may have a band gap larger than the band gap of silicon (1.1 electron volts (eV)). For example, the wide band gap semiconductor wafer may be a silicon carbide (SiC) wafer, or gallium arsenide (GaAs) wafer, or a gallium nitride (GaN) wafer.

More details and aspects are mentioned in connection with the examples described above or below. Processing a wide band gap semiconductor wafer may comprise one or more optional additional features corresponding to one or more aspects mentioned in connection with the proposed concept or one or more examples described above or below.

The aspects and features mentioned and described together with one or more of the previously described examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the disclosed subject matter to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, e.g. by expressions like "thereafter", for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

The transistor device 10 illustrated in FIG. 1 may be an IGBT (insulated gate bipolar transistor), or an IGFET (insulated gate field effect transistor), for example, a MOSFET (metal oxide semiconductor FET).

The transistor device 10 includes a semiconductor body 100 which may include a silicon carbide substrate with the main constituents silicon and carbon. The silicon carbide substrate may include impurities like hydrogen and oxygen and/or dopant atoms.

A first main surface 101 at a front side of the semiconductor body 100 may be planar or ripped. A surface normal 104 orthogonal to a planar first surface 101 or orthogonal to a mean plane of a ripped first surface 101 defines a vertical direction. Directions orthogonal to the surface normal 104 are horizontal and lateral directions. A second main surface 102 at the semiconductor body rear side may extend parallel to the first main surface 101.

The transistor device 10 includes a transistor cell array 610. Illustrated is a transistor cell TC of the transistor cell array 610 that may include a gate structure 150 that extends from the first main surface 101 into the semiconductor body 100. The gate structure 150 includes a trench gate dielectric 159 and a trench gate electrode 155 comprising carbon as one example of a control electrode 153. The carbon of the gate electrode 155 may comprise allotropes single-layered graphene, double-layered graphene, multi-layered graphene, graphenic-like carbon and/or carbon nanotubes. The gate electrode 155 is electrically separated from the semiconductor body 100. A cap layer 125 adjoins the gate electrode 155 and includes a nitride layer, a silicon carbide layer, and/or a polycrystalline silicon layer. The cap layer is configured as an oxygen barrier layer. For example, the gate dielectric 159 may separate (e.g., completely separate) the gate electrode 155 and the semiconductor body 100. A ratio of a length of the trench gate electrode 155 to a width w of the trench gate electrode 155 may range between $10^2$ and $10^5$, the width w being an extent of the trench gate electrode 155 along a second lateral direction x2 that is perpendicular to a first lateral direction x1 at a vertical level located at a center between the first main surface 101 and a bottom side of the trench gate electrode 155. The length of the trench gate electrode 155 is an extent of the trench gate electrode 155 along the first lateral direction x1 that may extend along a direction perpendicular to the drawing plane of FIG. 1.

The transistor cell TC further includes a source region 110, a body region 120, and a shielding region 140. The source region 110 and the body region 120 adjoin (e.g., directly adjoin) a first sidewall of the gate structure 150. The source region 110 is between the body region 120 and the first surface 101. The body region 120 separates the source region 110 from a drift structure 130. The drift structure 130 is formed between the body region 120 and the second surface 102. The body region 120 and the drift structure 130 form a first pn junction pn1. The body region 120 and the source region 110 form a second pn junction pn2.

The shielding region 140 may extend along a second sidewall of the gate structure 150 and optionally along at least a part of the trench bottom. A dopant concentration in the shielding region 140 along the second sidewall may be higher, e.g. at least ten times higher than a dopant concentration in the body region 120 along the first sidewall. A vertical extension of the shielding region 140 may be greater than a vertical extension of the gate structure 150. For example, a local dopant concentration maximum in the shielding region 140 may have a greater distance to the first surface 101 than a bottom of the gate structures 150.

The drift structure 130 includes a voltage sustaining layer. For example, the voltage sustaining layer may include a drift region 131. Vertical extension and dopant concentration in the drift region 131 are selected such that the transistor device 10 reaches its nominal blocking voltage capability. The drift region 131 may be formed in a layer grown by epitaxy. A mean net dopant concentration in the drift region 131 may be in the range from $1.0 \times 10^{15}$ cm$^{-3}$ to $5.0 \times 10^{16}$ cm$^{-3}$. A vertical extension of the drift region 131 is related to the nominal blocking capability of the semiconductor device 10. The vertical extension of the drift region 131 may be in the range of about 1 μm to several 10 μm or in the range between 5 μm and 12 μm.

The drift structure 130 further includes a heavily doped contact layer 139 adjoining (e.g., directly adjoining) the second main surface 102. The heavily doped contact layer 139 is in contact with a rear side metallization 320 that adjoins (e.g., directly adjoins) the second main surface 102. The rear side metallization 320 is one example of a second load terminal L2. Along the second main surface 102, a dopant concentration in the contact layer 139 is sufficiently high such that the contact layer 139 and the rear side metallization 320 form a low-resistive ohmic contact. In case the semiconductor device 10 is or includes an IGFET, the contact layer 139 has the same conductivity type as the drift region 131. In case the semiconductor device 10 is an IGBT, the contact layer 139 has the complementary conductivity type of the drift region 131 or includes zones of both conductivity types for implementing a reverse conducting IGBT, RC-IGBT.

The drift region 131 may adjoin (e.g., directly adjoin) the contact layer 139 or a field stop or buffer zone 135 may be formed between the drift region 131 and the contact layer 139. The field stop or buffer zone 135 forms a unipolar junction with the drift region 131. A vertical extension of the field stop of buffer zone 135 may be approximately in a range from 1 μm to 10 μm. A mean dopant concentration in the field stop or buffer zone 135 may be in a range from $1.0 \times 10^{17}$ cm$^{-3}$ to $5.0 \times 10^{18}$ cm$^{-3}$ or from $3.0 \times 10^{17}$ cm$^{-3}$ to $3.0 \times 10^{18}$ cm$^{-3}$ by way of example. The field stop of buffer zone 135 may relax mechanical stress in the semiconductor body 100 and/or may act as recombination layer for free charge carriers and/or may contribute to shaping the electric field in the drift structure 130.

The drift structure 130 may include further doped regions, for example barrier zones and/or current spread regions 137 of the conductivity type of the drift region 131 or counter-doped regions. Each current spread region 137 may adjoin (e.g., directly adjoin) or may be below a body region 120 and may extend between neighboring shielding regions 140. A mean net dopant concentration in the current spread regions 137 is higher than in the drift region 131.

A front side electrode 310 is electrically connected to the source region 110, the body region 120, and the shielding region 140. The front side electrode is one example of a first load electrode L1. An interlayer dielectric 210 electrically separates the front side electrode 310 and the gate electrode 155.

According to an example, the transistor cells TC are n-channel FET cells with p-doped body regions 120, n-doped source regions 110 and n-doped drift zone 131. According to another embodiment, the transistor cells TC are p-channel FET cells with n-doped body regions 120, p-doped source regions 110 and p-doped drift zone 131.

Figure 2:
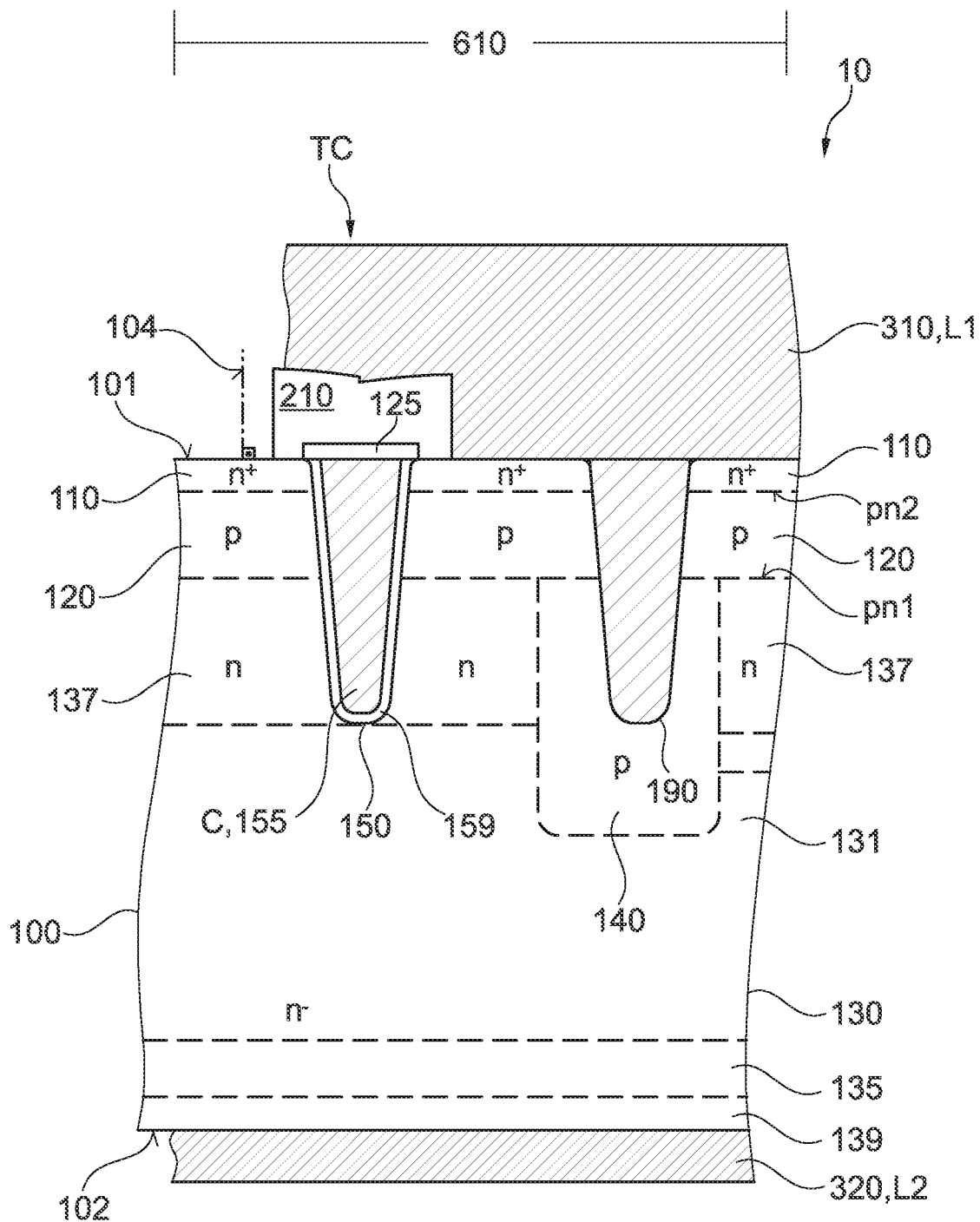

The schematic cross-sectional view of FIG. 2 illustrates an example of a transistor device 10 in a semiconductor body 100 which may include a silicon carbide substrate with the main constituent silicon and carbon. The example of FIG. 2 differs from the transistor device illustrated in FIG. 1 in that the body region 120 adjoins opposite sidewalls of the trench gate structure 150. The shielding region 140 is electrically connected to a trench contact 190, the trench contact 190 being laterally separated from the trench gate structure 150. The trench contact 190 is further electrically connected to the source region 110 and the body region 120 via sidewalls of the trench contact 190. A p$^+$-doped body contact region may be arranged between the body region 120 and the trench contact 190 for improving an ohmic contact between the body region 120 and the trench contact 190. Likewise, a p$^+$-doped shielding contact region may be arranged between the shielding region 140 and the trench contact 190 for improving an ohmic contact between the shielding region 140 and the trench contact 190.

Figure 3A:
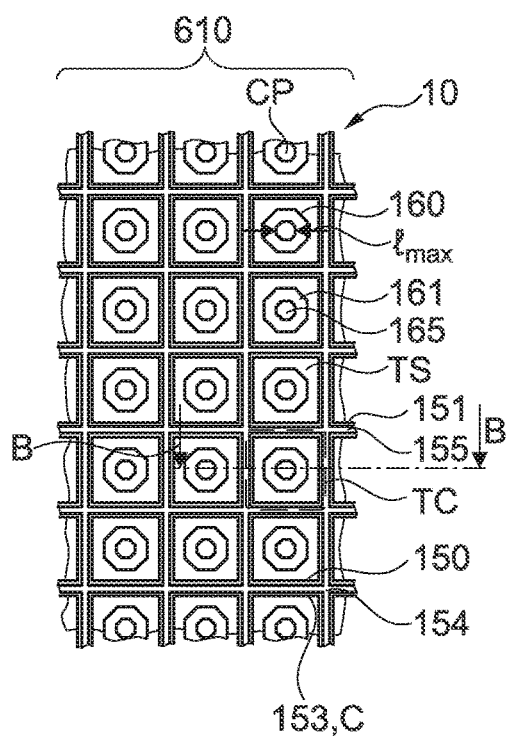
FIGS. 3A, 3B, 3C are schematic plan and cross-sectional views for illustrating examples of transistor devices including a trench gate electrode comprising carbon and a trench field electrode, wherein the trench gate electrode and the trench field electrode are arranged in trenches laterally separated from one another.
Figure 3B:
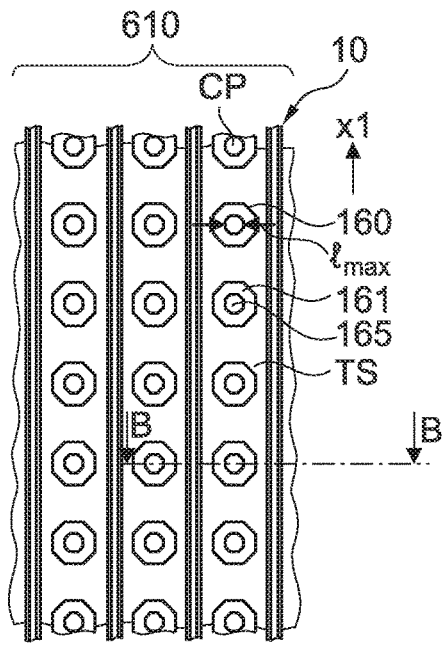
Figure 3C:
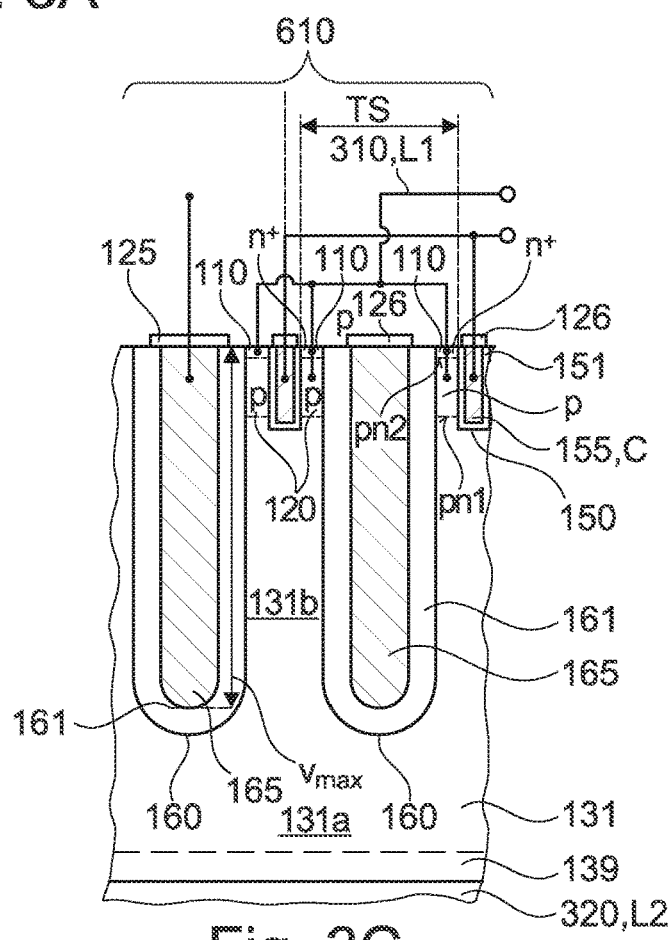

FIGS. 3A to 3C refer to a transistor device 10 including a plurality of transistor cells TC. Some and/or all transistor cells of the plurality of transistor cells TC may be identical to each other. Details described in the example above likewise apply to the illustrated examples described below. For avoiding repetitions of details, e.g. materials, dimensions, functions of elements or processes described in the examples above, these details correspondingly apply to the illustrated examples described further below.

The transistor device 10 is based on a semiconductor body 100 from a single crystalline semiconductor material such as silicon (Si), silicon carbide (SiC), germanium (Ge), a silicon germanium crystal (Site), gallium nitride (GaN), gallium arsenide (GaAs) or any other AiiiBv semiconductor.

Referring to the example illustrated in FIG. 3A, a transistor cell array 610 includes the transistor cells TC, wherein a gate structure 150 that forms a regular grid separates transistor sections TS of the transistor cells TC from each other. The gate structure 150 may form a grid (e.g., a complete grid) comprising meshes surrounding (e.g., completely surrounding) the transistor sections TS or may include gaps where connection sections of the semiconductor body 100 form bridges between neighboring transistor sections TS. According to the example illustrated in FIG. 3A, the gate structure 150 forms a grid and the transistor sections TS are formed in the meshes of the gate structure 150. The gate structure 150 extends from the first main surface 101 into the semiconductor body 100 and may include stripe-shaped gate edge portions 153 as well as gate node portions 154. Within the transistor cell array 610 each gate edge portion 153 extends along one common edge of two neighboring transistor sections TS. The gate edge portions 153 have uniform width and are straight without bends. The gate edge portions 153 may be formed along all edges of transistor sections TS of all functional transistor cells TC within the transistor cell array 610. The gate node portions 154 connect two, three or more of the gate edge portions 153 with each other and are formed at some or all of the nodes of the gate structure 150, wherein the gate structure 150 may include two or more different types of node portions 154.

Referring to the example illustrated in FIG. 3B, the transistor cell array 610 includes the transistor cells TC, wherein the plurality of transistor cells TC is formed as stripes extending in parallel along a first lateral direction x1.

The cross-sectional view of FIG. 3C is taken along cut line BB of FIG. 3A or FIG. 3B.

The gate structure 150 includes a gate electrode 155 comprising carbon. The gate electrode 155 is one example of a control electrode C comprising carbon. The gate electrode 155 is electrically insulated from the semiconductor body 100, wherein a gate dielectric 151 separates the gate electrode 155 at least from body regions 120. The gate dielectric 151 capacitively couples the gate electrode 155 to channel portions of the body regions 120. The gate dielectric 151 may include and/or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

A vertical extension of the gate structures 150 may be in a range from 100 nm to 5000 nm, for example in a range from 300 nm to 1000 nm. A horizontal width of the gate edge portions 153 may be in a range from 100 nm to 1000 nm, for example, from 250 nm to 750 nm.

The transistor sections TS of the transistor cells TC include semiconducting portions of the transistor cells TC as well as trench field electrode structures 160 that extend from the first main surface 101 into the semiconductor body 100. Portions of the trench field electrode structures 160 between the first surface 101 and buried end portions may have approximately vertical sidewalls or may taper (e.g., slightly taper) at an angle of, e.g., 89 degree with respect to the first surface 101. The sidewalls may be straight or bulgy (e.g., slightly bulgy).

The trench field electrode structures 160 may be equally spaced along parallel lines, wherein a plurality of first trench field electrode structures 160 with the same horizontal cross-section area may be arranged along each line, and wherein the lines may be equally spaced.

Each of trench field electrode structures 160 includes a trench field electrode 165 and a trench field electrode dielectric 161 surrounding the trench field electrode 165, respectively. The trench field electrode 165 includes and/or consists of carbon and/or a heavily doped silicon layer and/or a metal-containing layer. The trench field dielectric 161 separates the trench field electrode 165 from the surrounding semiconductor material of the semiconductor body 100 and may include and/or consist of a thermally grown silicon oxide layer, a deposited silicon oxide layer, e.g. a silicon oxide based on TEOS (tetraethylorthosilicate), or both. If the trench field electrode 165 includes carbon, a second cap layer 126 may be formed and adjoin the carbon of the trench field electrode 165.

A vertical extension of the trench field electrode structure 160 is smaller than a distance between the first main surface 101 and the contact portion 139 such that the drift region 131 may include a continuous drift section 131a between the trench field electrode structures 160 and the contact portion 139 as well as columnar drift sections 131b between neighboring trench field electrode structures 160. A vertical extension of the trench field electrode structures 160 is greater than a vertical extension of the gate structure 150. The vertical extension of the trench field electrode structures 160 may be in a range from 1 µm to 50 µm, for example in a range from 2 µm to 20 µm. First horizontal extensions of the trench field electrode structures 160 may be in a range from 0.1 µm to 20 µm, for example in a range from 0.2 µm to 5 µm, respectively. Trench field electrode structures 160 of neighboring lines of trench field electrode structures 160 may be offset with respect to a position along the first lateral direction x1.

The cross-sectional areas of the trench field electrodes 165 and the trench field electrode structures 160 may be rectangles, regular or distorted polygons with or without rounded and/or beveled corners, ellipses or ovals. According to an example, two orthogonal horizontal extensions are approximately equal and the cross-sectional areas of the trench field electrodes 165 and the trench field electrode structures 160 are circles or regular polygons with or without rounded or beveled corners, such as octagons, hexagons or squares. A ratio of a maximum lateral extent lmax of the trench field electrode 165 to a maximum vertical extent vmax of the trench field electrode may range between 0.05 and 0.5.

The trench field electrode structures 160 allow high dopant concentrations (e.g., dopant concentration higher than a threshold dopant concentration) in the drift structure 131 without loss of blocking capability of the transistor device 10. The needle-shaped trench field electrodes 165 increase the available cross-sectional area for the drift region 131 and reduce the on-state resistance RDSon compared to stripe-shaped field electrodes.

The transistor sections TS with the semiconducting portions of the transistor cells TC are formed in mesa sections of the semiconductor body 100, protruding from a continuous section of the semiconductor body 100 between the trench field electrode structures 160 and the second main surface 102. A horizontal mean width of the mesa sections may be in a range from 0.2 µm to 10 µm, for example in a range from 0.3 µm to 1 µm.

Each transistor section TS includes a body region 120 of the second conductivity type. The body regions 120 form first pn junctions pn1 with the drift structure 130, e.g., the columnar drift sections 131b, and second pn junctions pn2 with source regions 110 formed between the body regions 120 and the first surface 101. Each body region 120 may include a heavily doped portion for forming an ohmic contact with a metal contact structure.

The source regions 110 may be wells extending from the first surface 101 into the semiconductor body 100, for example into the body regions 120. The source regions 110 may adjoin (e.g., directly adjoin) the trench field electrode structures 160 or may be spaced from the trench field electrode structures 160.

The source regions 110 as well as the body regions 120 are electrically connected to a front side electrode 310. The front side electrode is one example of a first load electrode L1. The first load electrode L1 is, for example, the source terminal in case the transistor device 10 is an IGFET, or an emitter terminal in case the transistor device 10 is an IGBT. A variety of contact schemes may be used to electrically connect the source regions 110 and the body regions 120 to the front side electrode L1, e.g. by groove contacts or by parts of a mesa along a longitudinal direction of the mesa where the body regions 120 extend to the front side for being electrically connected. These and further contact variations are illustrated in the cross-sectional view of FIG. 3C in a simplified manner by contact nodes within the body region 120 and within the source region 110.

A rear side electrode 320, which adjoins (e.g., directly adjoins) the second main surface 102 and the contact portion 139, is one example of second load electrode L2, which may be the drain terminal in case the transistor device 10 is an IGFET, or a collector terminal in case the transistor device 10 is an IGBT.

The trench field electrodes 165 may be electrically connected to the first load electrode L1, to another terminal of the transistor device 10, to an output of an internal or external driver circuit, or may float. The trench field electrodes 165 may also be divided in different sub-electrodes which may be insulated from each other and which may be coupled to identical or different potentials.

In the illustrated examples and the corresponding description, the body regions 120 are p-type, whereas the source regions 110 and the drift structure 131 are n-type. Similar considerations as outlined below apply also to examples with n-type body regions 120, p-type source regions 110, and a p-type drift region 131.

When a voltage applied to the gate electrode 155 exceeds a preset threshold voltage, electrons accumulate and form inversion channels in the channel portions of the body regions 120 adjoining (e.g., directly adjoining) the gate dielectric 151 in the body regions 120. Thus, a load current flows between the first and second load electrodes L1, L2 in vertical direction through the transistor device 10.

Figure 4:
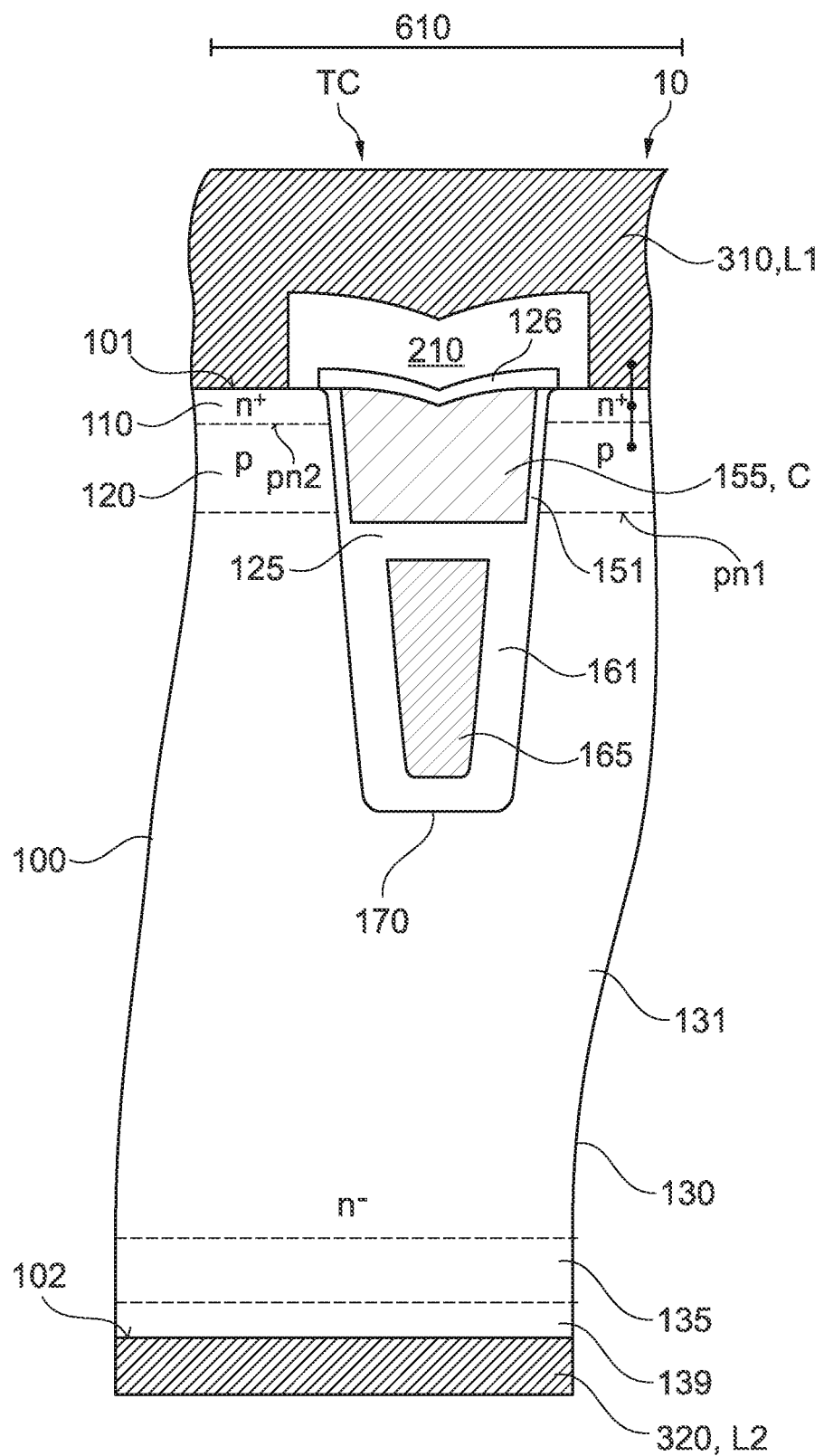
FIG. 4 is a schematic cross-sectional view for illustrating an example of a transistor device including a trench gate electrode and a trench field electrode, wherein the trench gate electrode and the trench field electrode are arranged vertically spaced from one another in a trench.

FIG. 4 refers to an example of a transistor device 10 including a plurality of transistor cells TC in a transistor cell array 610. Structural or functional details of features described with reference to FIGS. 1 to 3C that are common to the example illustrated in FIGS. 1 to 3C likewise apply.

In the transistor device 10 illustrated in FIG. 4, a trench electrode structure 170 includes the trench gate electrode 155 and the gate trench dielectric 151. The trench electrode structure 170 further includes trench field electrode 165, and the trench field dielectric 161. The trench field electrode 165 is arranged between the trench gate electrode 155 and the second main surface 102. One electrode, e.g. the trench gate electrode 155 or the trench field electrode 165, or both electrodes, e.g. the trench gate electrode 155 and the trench field electrode 165, may comprise carbon as an electrode material. When the trench gate electrode 155 includes carbon, a second cap layer 126 may adjoin the carbon of the trench gate electrode 155. When the trench field electrode 165 includes carbon, a cap layer 125 may adjoin the carbon of the trench field electrode 165.

The trench field electrode 165 may be electrically connected to the first load electrode L1, to another terminal of the transistor device 10, to an output of an internal or external driver circuit, or may float. The trench field electrode 165 may also be divided in different sub-electrodes which may be insulated from each other and which may be coupled to identical or different potentials.

According to an example, the transistor cells TC are n-channel FET cells with p-doped body regions 120, n-doped source regions 110 and n-doped drift zone 131.

According to another embodiment, the transistor cells TC are p-channel FET cells with n-doped body regions 120, p-doped source regions 110 and p-doped drift zone 131.

The description and drawings merely illustrate the principles of the disclosure. Furthermore, all examples recited herein are principally intended expressly to be only for illustrative purposes to aid the reader in understanding the principles of the disclosure and the concepts contributed by the disclosed subject matter to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, e.g. by expressions like "thereafter", for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

The aspects and features mentioned and described together with one or more of the previously detailed examples and figures, may as well be combined with one or more of the other examples in order to replace a like feature of the other example or in order to additionally introduce the feature to the other example.

More details and aspects are mentioned in connection with the embodiments described above or below. Processing the wide band gap semiconductor wafer may comprise one or more optional additional features corresponding to one or more aspects mentioned in connection with the proposed concept or one or more embodiments described above or below.

What is claimed is:

1. A transistor device, comprising:
   a semiconductor body having a first main surface, a second main surface opposite to the first main surface, and a transistor cell array, wherein:
   the transistor cell array comprises:
      a plurality of transistor cells;
      a first load electrode over the first main surface, wherein the first load electrode is electrically connected to the plurality of transistor cells; and
      a second load electrode over the second main surface, wherein the second load electrode is electrically connected to the plurality of transistor cells;
   the plurality of transistor cells comprises at least one control electrode comprising carbon;
   the carbon of the at least one control electrode comprises at least one of allotropes single-layered graphene, double-layered graphene, multi-layered graphene, graphenic-like carbon or carbon nanotubes;
   the at least one control electrode comprises a gate electrode;
   a cap layer is over the gate electrode;
   a gate dielectric separates the gate electrode from the semiconductor body;
   the cap layer is at least one of (i) directly over and in contact with a vertical portion of the gate dielectric or (ii) directly over an entirety of the gate dielectric and in contact with the gate dielectric; and
   an interlayer dielectric is over the cap layer, wherein the interlayer dielectric separates the gate electrode and a front side electrode.

2. The transistor device of claim 1, wherein the cap layer comprises at least one of a nitride layer, a silicon carbide layer, or a polycrystalline silicon layer.

3. The transistor device of claim 1, wherein the gate electrode of the at least one control electrode comprises a planar gate electrode or a trench gate electrode.

4. The transistor device of claim 3, wherein the plurality of transistor cells is formed as stripes extending in parallel along a first lateral direction.

5. The transistor device of claim 3, comprising a trench field electrode, wherein a ratio of a maximum lateral extension of the trench field electrode to a maximum vertical extension of the trench field electrode ranges between 0.05 and 0.5, and wherein the trench field electrode and the trench gate electrode are arranged in trenches laterally separated from one another.

6. The transistor device of claim 3, wherein the at least one control electrode comprises a trench field electrode, and wherein the trench field electrode is arranged between the trench gate electrode and the second main surface.

7. The transistor device of claim 1, wherein the cap layer is directly over and in contact with the vertical portion of the gate dielectric.

8. The transistor device of claim 1, wherein the cap layer is directly over the entirety of the gate dielectric and in contact with the gate dielectric.

9. The transistor device of claim 1, comprising a drift region, wherein the drift region is configured for a breakdown voltage between the first load electrode and the second load electrode of greater than 12 volts (V).

10. The transistor device of claim 9, wherein the drift region is in a silicon semiconductor body, and the transistor device is an insulated gate field effect transistor or an insulated gate bipolar transistor.

11. The transistor device of claim 9, wherein the drift region is in a silicon carbide semiconductor body, the transistor device is an insulated gate field effect transistor or an insulated gate bipolar transistor, and the at least one control electrode comprises a trench gate electrode, and wherein the transistor device comprises a shielding region of a conductivity type different from a conductivity type of the drift region, and a bottom side of the shielding region is arranged between a bottom side of a gate trench comprising the trench gate electrode and the second main surface.

12. A transistor device, comprising:
   a semiconductor body having a first main surface, a second main surface opposite to the first main surface, and a transistor cell array, wherein:
   the transistor cell array comprises:
      a plurality of transistor cells;
      a first load electrode over the first main surface, wherein the first load electrode is electrically connected to the plurality of transistor cells; and
      a second load electrode over the second main surface, wherein the second load electrode is electrically connected to the plurality of transistor cells;
   the plurality of transistor cells comprises at least one control electrode comprising carbon;
   the carbon of the at least one control electrode comprises at least one of allotropes single-layered graphene, double-layered graphene, multi-layered graphene, graphenic-like carbon or carbon nanotubes;

the at least one control electrode comprises a gate electrode comprising at least one of a planar gate electrode or a trench gate electrode;
a cap layer over the at least one control electrode;
a gate dielectric separates the gate electrode from the semiconductor body;
the cap layer is at least one of (i) directly over and in contact with a vertical portion of the gate dielectric or (ii) directly over an entirety of the gate dielectric and in contact with the gate dielectric; and
an interlayer dielectric over the cap layer, wherein the interlayer dielectric separates the gate electrode and a front side electrode.

13. A transistor device, comprising:
a semiconductor body having a first main surface, a second main surface opposite to the first main surface, and a transistor cell array, wherein:
the transistor cell array comprises:
a plurality of transistor cells;
a first load electrode over the first main surface, wherein the first load electrode is electrically connected to the plurality of transistor cells; and
a second load electrode over the second main surface, wherein the second load electrode is electrically connected to the plurality of transistor cells;
the plurality of transistor cells comprises at least one control electrode comprising carbon;
the carbon of the at least one control electrode comprises at least one of allotropes single-layered graphene, double-layered graphene, multi-layered graphene, graphenic-like carbon or carbon nanotubes;
the at least one control electrode comprises a gate electrode;
a cap layer is over the gate electrode;
a gate dielectric separates the gate electrode from the semiconductor body;
the cap layer is at least one of (i) directly over and in contact with a vertical portion of the gate dielectric or (ii) directly over an entirety of the gate dielectric and in contact with the gate dielectric;
an interlayer dielectric is over the cap layer; and
a drift region, wherein the drift region is configured for a breakdown voltage between the first load electrode and the second load electrode of greater than 12 volts (V), wherein the drift region is in a silicon carbide semiconductor body, the transistor device is an insulated gate field effect transistor or an insulated gate bipolar transistor, and the at least one control electrode comprises a trench gate electrode, and wherein the transistor device comprises a shielding region of a conductivity type different from a conductivity type of the drift region, and a bottom side of the shielding region is arranged between a bottom side of a gate trench comprising the trench gate electrode and the second main surface.

14. The transistor device of claim 13, wherein the cap layer comprises at least one of a nitride layer, a silicon carbide layer, or a polycrystalline silicon layer.

15. The transistor device of claim 13, wherein the gate electrode of the at least one control electrode comprises a planar gate electrode or a trench gate electrode.

16. The transistor device of claim 15, wherein the plurality of transistor cells is formed as stripes extending in parallel along a first lateral direction.

17. The transistor device of claim 15, comprising a trench field electrode, wherein a ratio of a maximum lateral extension of the trench field electrode to a maximum vertical extension of the trench field electrode ranges between 0.05 and 0.5, and wherein the trench field electrode and the trench gate electrode are arranged in trenches laterally separated from one another.

18. The transistor device of claim 15, wherein the at least one control electrode comprises a trench field electrode, and wherein the trench field electrode is arranged between the trench gate electrode and the second main surface.

19. The transistor device of claim 13, wherein the cap layer is directly over and in contact with the vertical portion of the gate dielectric.

20. The transistor device of claim 13, wherein the cap layer is directly over the entirety of the gate dielectric and in contact with the gate dielectric.

* * * * *